(12) United States Patent
Pidutti et al.

(10) Patent No.: US 10,666,158 B2
(45) Date of Patent: May 26, 2020

(54) RECTIFIER DEVICE

(71) Applicant: Infineon Technologies AG, Neubiberg (DE)

(72) Inventors: Albino Pidutti, Villach (AT); Damiano Gadler, Klagenfurt (AT); Ioannis Pachnis, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/425,718

(22) Filed: May 29, 2019

(65) Prior Publication Data

US 2019/0372476 A1 Dec. 5, 2019

(30) Foreign Application Priority Data

Jun. 1, 2018 (DE) .......................... 10 2018 113 145

(51) Int. Cl.
*H02M 7/217* (2006.01)
*H02M 1/14* (2006.01)
*H01L 27/06* (2006.01)

(52) U.S. Cl.
CPC ........ *H02M 7/217* (2013.01); *H01L 27/0629* (2013.01); *H02M 1/14* (2013.01)

(58) Field of Classification Search
CPC ...... H02M 7/217; H02M 1/14; H01L 27/0629
See application file for complete search history.

(56) References Cited

U.S. PATENT DOCUMENTS

| 5,362,980 | A | 11/1994 | Gough | |
|---|---|---|---|---|
| 6,229,180 | B1 * | 5/2001 | Yoshida | ................ H01L 25/071 257/139 |
| 7,605,446 | B2 * | 10/2009 | Udrea | ................. H01L 29/0657 257/341 |
| 7,842,568 | B2 * | 11/2010 | Anderson | ........... H01L 29/1083 257/229 |
| 9,281,680 | B2 * | 3/2016 | Nakayama | ............ H02M 1/088 |
| 9,960,705 | B1 | 5/2018 | Pidutti et al. | |
| 2013/0107583 | A1 * | 5/2013 | Seok | ................. H02M 3/33576 363/21.12 |

(Continued)

FOREIGN PATENT DOCUMENTS

| DE | 69316675 T2 | 7/1998 |
|---|---|---|
| DE | 102013206057 A1 | 10/2013 |
| DE | 102013218959 A1 | 3/2014 |

OTHER PUBLICATIONS

Office Action, in the German language, from counterpart German Application No. 102018113145.3, dated Jan. 15, 2019, 10 pp.

*Primary Examiner* — Emily P Pham
(74) *Attorney, Agent, or Firm* — Shumaker & Sieffert, P.A.

(57) ABSTRACT

A rectifier device is described herein. In accordance with one embodiment, the rectifier device includes a semiconductor body doped with dopants of a first doping type and one or more well regions arranged in the semiconductor body and doped with dopants of a second doping type. The rectifier device further includes a controllable resistance circuit that is electrically connected between the semiconductor body and a first well region of one or more well regions and configured to provide a resistive current path between the semiconductor body and the first well region. The resistance of the current path is dependent on an instantaneous level of an alternating input voltage.

10 Claims, 6 Drawing Sheets

(56) References Cited

U.S. PATENT DOCUMENTS

| | | |
|---|---|---|
| 2013/0264654 A1 | 10/2013 | Weis et al. |
| 2014/0084295 A1 | 3/2014 | Hirler et al. |
| 2014/0375287 A1* | 12/2014 | Blanchard .......... H01L 29/0817 323/271 |
| 2018/0167000 A1* | 6/2018 | Pidutti .................... H02M 1/32 |

* cited by examiner

RECTIFIER DEVICE

This application claims priority to German Application Number 102018113145.3, filed on Jun. 1, 2018, the entire content of which is incorporated herein by reference.

TECHNICAL FIELD

This application relates to the field of power supplies, in particular to rectifier circuits and devices and related methods and devices.

BACKGROUND

In an electric power grid electricity is, for various reasons, usually distributed to customers in the form of alternating current (AC). Also alternators are used, for example, in automobiles to generate alternating current. In many applications, alternating current must be converted into direct current (DC) in order to provide a DC supply for electronic circuits or other devices that need a DC supply. This conversion process is referred to as rectification. The standard components used to build a rectifier are silicon diodes. Several types of rectifiers exists. One common type is a single-phase full-wave rectifier that is usually built using four diodes connected in a bridge configuration (a so-called Graetz bridge). As a side note, it should be mentioned that the alternating voltage provided by an electric power grid (e.g. 120 or 230 volts) is usually transformed to lower voltages using transformers before being rectified. In the automotive sector, alternators usually generate multiple-phase output voltages, and, for example, a three-phase full-wave rectifier includes six diodes. Further, rectifier diodes may also be used, for example, in (DC/DC or AC/DC) converters.

Silicon diodes have forward voltages of approximately 0.6 to 0.7 volts. Schottky and germanium diodes have slightly lower forward voltages of approximately 0.3 volts. The forward voltage of a pn-junction (i.e. of a diode) depends on the semiconductor material and can therefore be practically regarded as a constant parameter for a specific semiconductor manufacturing technology, which normally is based on silicon. It is understood, however, that the actual forward voltage is temperature dependent. That is, silicon diodes will always produce a power dissipation of approximately 600 to 700 milliwatts per ampere load current. A diode bridge (bridge rectifier), which is composed of four diodes, thus produces a power dissipation of approximately 1.2 to 1.4 watts per ampere (RMS) of load current as two diodes are always forward biased in a diode bridge. Particularly for comparably low voltages (e.g. 5 to 15 volts), the power dissipation in the rectifier can be a significant portion of the total power consumption.

To reduce power dissipation in rectifier devices, a technique referred to as active rectification may be used. Thereby, silicon diodes are replaced by power transistors such as power MOS field effect transistors (MOSFETs) or power bipolar junction transistors (BJTs), which have a comparably low on-resistance and thus may produce a significantly lower voltage drop as compared to simple silicon diodes. However, usually a relatively complex control circuit is needed to switch the transistor on and off synchronously to the alternating voltage. Different from ordinary high-side semiconductor switches, which are operated at a DC supply voltage, rectifier devices with power MOS transistors are operated at alternating supply voltages. The rectifier may include a control circuit that is configured to switch the power MOS transistor on and off synchronously with the alternating supply voltage. Dependent on the actual implementation another challenge may be the prevention of latch-up effects which may be triggered by the alternating supply voltage, when alternating between positive and negative voltage levels.

SUMMARY

A rectifier device is described herein. In accordance with one embodiment, the rectifier device includes a semiconductor body doped with dopants of a first doping type and one or more well regions arranged in the semiconductor body and doped with dopants of a second doping type. Thus, the one or more well regions and the surrounding semiconductor body form a pn-junction. The rectifier device includes an anode terminal and a cathode terminal connected by a load current path of a first MOS transistor and a diode, which is connected parallel to the load current path. During operation, an alternating input voltage is applied between the anode terminal and the cathode terminal. The rectifier device includes a control circuit that is configured to switch on the first MOS transistor for an on-time period, during which the diode is forward biased. The first MOS transistor and the diode are integrated in the semiconductor body, and the control circuit is at least partly arranged in the one or more well regions. The rectifier device further includes a controllable resistance circuit that is electrically connected between the semiconductor body and a first well region of the one or more well regions and configured to provide a resistive current path between the semiconductor body and the first well region. The resistance of the current path is dependent on the instantaneous level of the alternating input voltage.

Furthermore, a semiconductor device is described herein that, in accordance with one embodiment, includes a semiconductor body doped with dopants of a first doping type and one or more well regions arranged in the semiconductor body and doped with dopants of a second doping type. During operation, an alternating substrate voltage is applied to the semiconductor body. The semiconductor device includes a supply circuit configured to provide an internal supply voltage based on the alternating substrate voltage for supplying further circuitry included in the semiconductor body. The supply circuit includes at least one capacitor and at least one transistor, which is formed in a first well region of the one or more well regions. The at least one transistor is coupled between the semiconductor body and the capacitor and configured to charge the capacitor when the substrate voltage is higher than a threshold voltage. A controllable resistance circuit is electrically connected between the semiconductor body and a first well region and configured to provide a resistive current path between the semiconductor body and the first well region. The resistance of the current path is dependent on the instantaneous level of the alternating substrate voltage.

BRIEF DESCRIPTION OF THE DRAWINGS

The embodiment described herein can be better understood with reference to the following description and drawings. The components in the figures are not necessarily to scale, emphasis instead being placed upon illustrating the principles of the embodiments. Furthermore, in the figures, like reference numerals designate corresponding parts. In the drawings:

FIG. 2 illustrates a power MOSFET which can be used to replace a diode in a rectifier circuit, wherein, in the embodiments described herein, the power MOSFET is reverse conducting when switched on.

DETAILED DESCRIPTION

Figure 1:
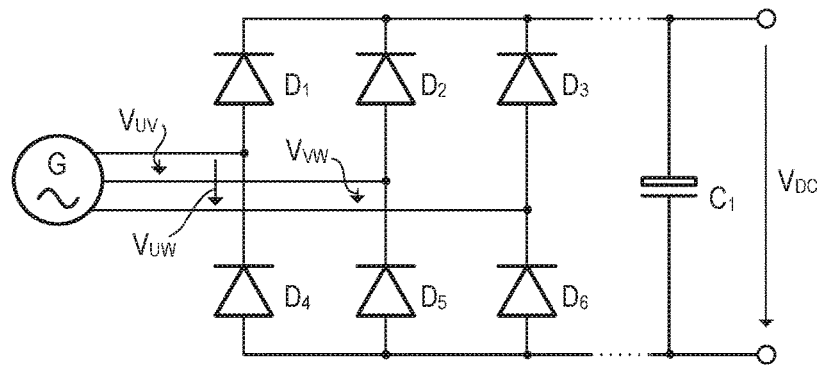
FIG. 1 illustrates, as an illustrative example, a three-phase full-wave rectifier circuit composed of six diodes connected to a three-phase alternator.

As mentioned above, several types of rectifiers exist. FIG. 1 illustrates one exemplary implementation of a three-phase full-wave rectifier, which is built using six diodes $D_1$, $D_2$, $D_3$, $D_4$, $D_5$, $D_6$ connected in a bridge configuration (a so-called three-phase rectifier bridge). FIG. 1 also illustrates a three-phase AC voltage source G which may represent, for example, an electric grid, the secondary sides of a three-phase transformer, an AC generator such as a three-phase alternator used in an automobile, or any other common AC voltage source. The voltage source G provides three-phases, which are connected to the rectifier bridge. The AC voltages between the phases are denoted as $V_{UV}$, $V_{UW}$, and $V_{VW}$. A capacitor $C_1$ may be connected to the output of the rectifier bridge to reduce the ripple of the DC output voltage $V_{DC}$. As mentioned, an automotive battery may be coupled to the rectifier bridge so that the battery can be charged by the generator G.

Silicon diodes usually have a forward voltage of approximately 0.6 to 0.7 volts, and therefore may cause significant power dissipation. To reduce the power dissipation, a silicon diode may be replaced by a rectifier device including a controllable semiconductor switch. In the example illustrated in FIG. 2, the rectifier device 10 includes a power MOS transistor $M_P$ (MOSFET), which has an intrinsic diode $D_R$ (body diode) coupled in parallel to the load current path (drain-source current path) of the power MOS transistor $M_P$.

The node and cathode terminals of the rectifier device 10 correspond to anode and cathode of the intrinsic diode and are labelled A and K, respectively. Although a MOSFET is used in the examples described herein, an IGBT with an integrated reverse diode may be used instead. Generally, the rectifier device 10 may have only two terminals and thus may be used as a simple replacement for a normal silicon diode.

Unlike in known active rectifier circuits (also referred to as "synchronous rectifiers"), the power MOS transistor $M_P$ is operated in a reverse conducting mode. Basically, a standard rectifier diode (as used for example in the rectifier bridge of FIG. 1) is replaced by the body diode (see FIG. 2, diode $D_R$) of a power MOS transistor, which can be bypassed by the MOS channel of the power MOS transistor, when the power MOS transistor is activated (i.e. switched on). That is, the power MOS transistor is switched on (which makes the MOS channel conductive), when the body diode is forward biased, thus bypassing the load current path through the body diode. When the diode $D_R$ is reverse biased, the MOSFET $M_P$ is always off during normal operation. In the example depicted in FIG. 2, the rectifier device 10 has only two terminals, a first terminal A (connected to the anode of the body diode $D_R$) and a second terminal K (connected to the cathode of the body diode $D_R$). As will be explained later, the control circuit used to switch the MOSFET $M_P$ on and off may be integrated in the same semiconductor die as the MOSFET $M_P$, and the internal supply of the integrated control circuit may be internally generated from the AC voltage applied at the two terminals A and K. As only two terminals are used by the rectifier device 10, it can readily be used as a replacement for ordinary silicon rectifier diodes to reduce power losses.

Figure 2:
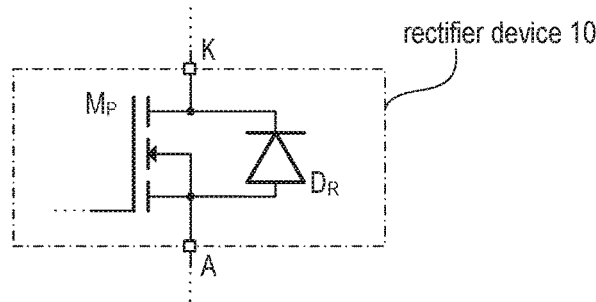
Figure 3:
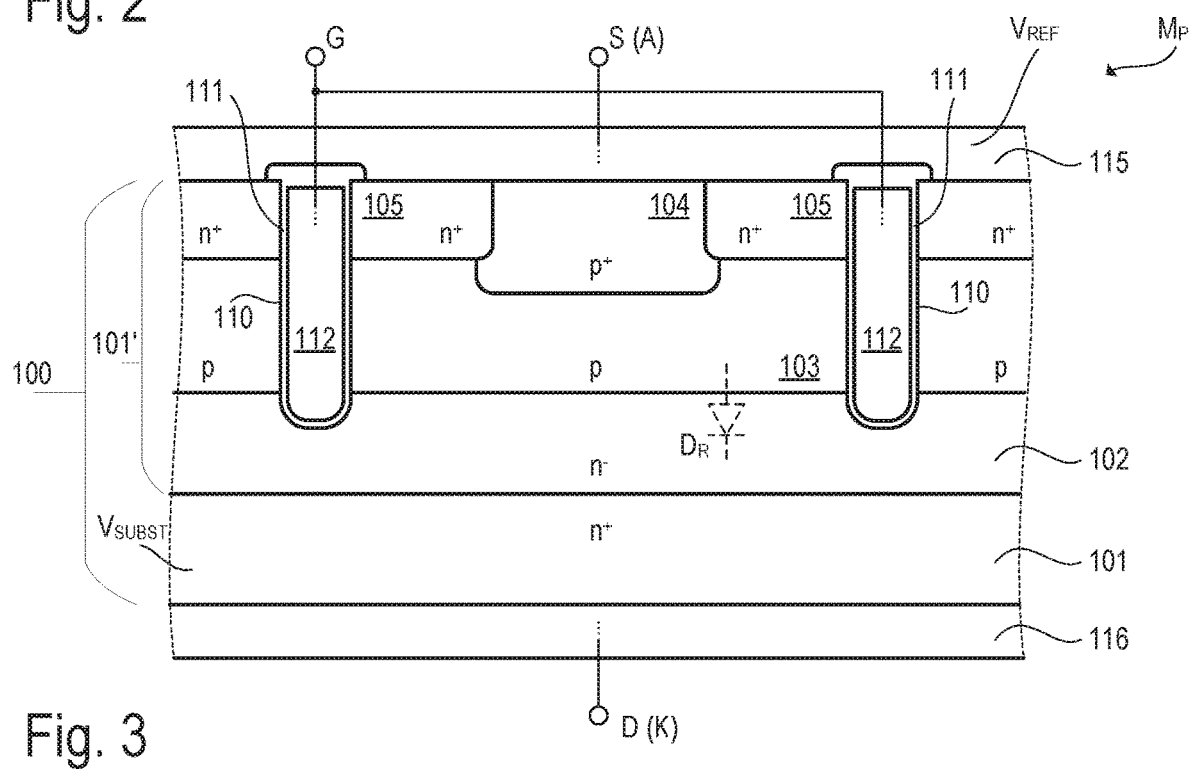
FIG. 3 is a cross-sectional view of a semiconductor body illustrating exemplary implementation of the power MOSFET of FIG. 2.

FIG. 3 illustrates one exemplary implementation of the power MOS transistor $M_P$ of FIG. 2 in a silicon substrate. In the present example, the MOSFET is implemented using a vertical transistor structure composed of a plurality of transistors cells. The term "vertical" is commonly used in the context of power transistors and refers to the direction of the load current path (MOS channel), which extends vertically with respect to a horizontal plane defined by the bottom plane of the semiconductor substrate. The term "vertical" can thus be used to discriminate vertical transistors from planar transistors, in which the load current path (MOS channel) extends parallel to the horizontal plane. In the present example, the vertical MOS transistor is implemented as a so-called trench transistor, which has its gate electrodes arranged in trenches formed in the silicon body. However, other types of vertical power transistors or other types of transistors may be used as well.

Power MOS transistors are usually formed by a plurality of transistors cells coupled in parallel. In the example of FIG. 3, the semiconductor body 100 is essentially formed by a semiconductor substrate 101 (wafer), on which a (e.g. monocrystalline) semiconductor layer 101' is deposited using epitaxial growth. The semiconductor substrate 101 and the semiconductor layer 101' may be doped with dopants of a first doping type, e.g. n-type dopants, wherein the concentration of dopants may be much lower in the semiconductor layer 101' (therefore labelled n) as compared to the highly doped substrate 101 (labelled n⁺). Trenches 110 are formed in the semiconductor layer by an anisotropic etching process. The trenches 110 extend—from the top surface of the semiconductor body 100—vertically into the semiconductor body 100 and are filled with conductive material (e.g. highly doped polycrystalline silicon) to form gate electrodes 112 within the trenches 110. The gate electrodes 112 are isolated from the surrounding semiconductor body 100 by an oxide layer 111, which is disposed on the inner surfaces of the trenches 110 (e.g. by an oxidation process) before filling them with the mentioned conductive material.

An upper portion of the semiconductor layer 101' is doped with dopants of a second doping type, e.g. p-type dopants, e.g. using a first doping process (e.g. diffusion process of dopants or ion implantation). The resulting p-doped region is usually referred to as the body region 103, whereas the remaining n-doped portion of the semiconductor layer 101' (directly adjoining the substrate 101) forms the so-called drift region 102 of the MOS transistor. As the trenches 110 extend down to the drift region 102, the body region 103 is segmented into a plurality of body regions associated with a respective plurality of transistor cells.

A second doping process (e.g. diffusion process of dopants or ion implantation) is used to form source regions 105. Therefore, the MOS transistor $M_P$ is also referred to as DMOS (double-diffused metal-oxide-semiconductor) transistor. The source regions are doped with dopants of the same type as the substrate 101 (e.g. n-type dopants). The concentration of dopants may be comparably high (therefore labelled $n^+$), but is not necessarily equal to the concentration of dopants in the substrate 101. The source regions 105 extend vertically into the semiconductor body starting from the top surface of the semiconductor body and adjoining the trenches 112. Body contact regions 104, which are doped with dopants of the same type as the body regions 103, may be formed between neighboring trenches 110 in order to allow to electrically contact the body regions 103 at the top surface of the semiconductor body 100. The source regions 105 and the body contract regions 104 are electrically contacted at the top surface of the semiconductor body 100 by the conductive layer 115 (e.g. metal layer) that forms the source electrode S of the power MOS transistor. Thereby the individual transistors cells are electrically connected in parallel. The gate electrodes 112 in the trenches 110 must be isolated from the conductive layer 115 and are also connected to each other, e.g. at the end of the trenches 110 (not visible in FIG. 3). The drain electrode D is formed by another conductive layer 116 at the bottom surface of the semiconductor body 100.

The body diode $D_R$ (see also FIG. 3) of the MOSFET is also shown in the cross-sectional view of FIG. 3. It is formed by the p-n junctions at the transitions between the body regions 103 (in each transistor cell) and the drift region 102. The source electrode S (which is electrically connected to the source and body contact regions 105, 104) is therefore also the anode of the diode $D_R$, and the drain electrode D is also the cathode of the diode $D_R$. A transistor designed according to the example of FIG. 3 or similar transistor designs are as such known (sometimes referred to as DMOS transistor) and thus not further explained in detail.

What should be mentioned at this point is that the MOS transistor $M_P$ is not the only component integrated in the substrate. All other circuitry needed to control the switching operation of the MOS transistor $M_P$ can also be integrated in the same semiconductor body 100. The embodiments described herein may be designed as two-terminal rectifier devices (terminals A and K), which have only two external pins and essentially behave like diodes. Unlike a normal silicon diode, the rectifier devices described herein may be designed to have a very low forward voltage as the low-resistive MOS channel bypasses the current path through the body diode $D_R$ while the body diode is forward biased. In the following, the potential at the first terminal A (anode, corresponds to the source electrode of the power MOS transistor $M_P$) is denoted as reference voltage $V_{REF}$, whereas the voltage at the second terminal K (cathode, corresponds to the drain electrode of the power MOS transistor $M_P$) is denoted as substrate voltage $V_{SUBST}$ (voltage present in the substrate 101, see FIG. 3). The reference voltage $V_{REF}$ may be regarded as (floating) ground potential for the circuitry included in the rectifier device 10.

Figure 4:
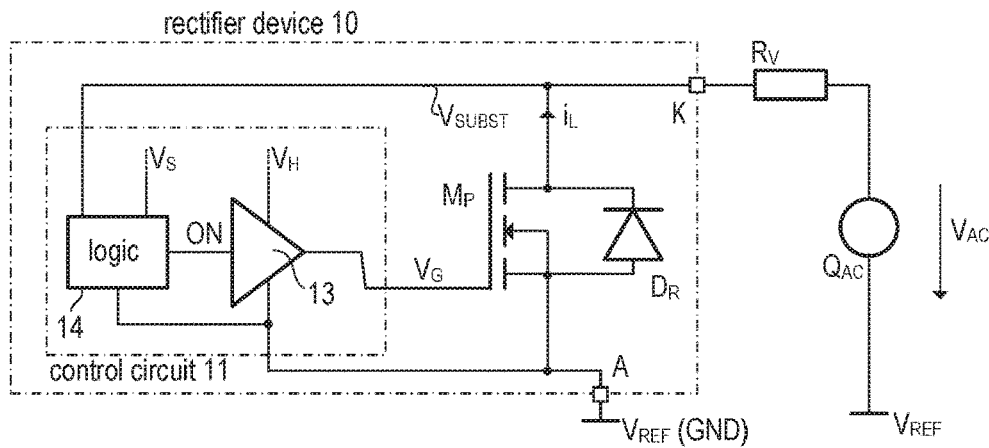
FIG. 4 is a circuit diagram illustrating the power MOSFET of FIG. 2 and a control circuit that is configured to actively switch the MOSFET on when the body diode becomes forward biased.

FIG. 4 illustrates the rectifier device 10 of FIG. 2 in more detail. Accordingly, the rectifier device includes the MOSFET $M_P$ (DMOS transistor), which includes the intrinsic reverse diode $D_R$ (see FIG. 2) as well as a control circuit 11 connected to a gate terminal of the MOS transistor $M_P$. As explained above, the MOS transistor $M_P$ and its intrinsic body diode $D_R$—and also the control circuit 11—are connected between the first and the second terminals A and K. The electric potential $V_{REF}$ at the first terminal (anode) can be defined as zero volts (0 V) and can thus be regarded as reference or ground potential (ground GND) for all circuitry integrated in the semiconductor body 100. With respect to the reference potential $V_{REF}$, the substrate voltage $V_{SUBST}$ may oscillate from negative values of approximately −0.7 volts minimum (i.e. the negative forward voltage of the body diode $D_R$) to a positive peak value $V_{AC\_MAX}$ of an alternating input voltage applied between the two terminals A and K. In the example of FIG. 4, the rectifier device 10 is supplied by an AC source $Q_{AC}$ via a resistor $R_V$. However, supplying the rectifier device 10 as illustrated in FIG. 4 should be regarded merely as a hypothetical example, which is used to explain the function of the rectifier device 10.

In the present example, the control circuit 11 includes a logic circuit 14, which implements the control function for switching the power MOS transistor on and off, as explained further below with reference to FIGS. 7A and 7B, and a gate driver 13 that generates a gate signal $V_G$ based on the logic signal ON provided by the logic circuit 14. The internal supply voltage $V_S$ may be provided by a supply circuit as shown, for example, in FIG. 6. The supply voltage $V_H$ for the gate driver 13 may be buffered, for example, by a capacitor (not shown). The logic circuit 14 is basically configured to detect that the substrate voltage $V_{SUBST}$ has become negative and trigger the activation the MOS transistor $M_P$ by setting the logic signal ON e.g. to a high level. The logic circuit 14 is basically configured to detect that the substrate voltage $V_{SUBST}$ is about to become again positive and trigger the deactivation of the MOS transistor $M_P$. As mentioned, a negative substrate voltage $V_{SUBST}$ entails a forward biasing of the body diode $D_R$.

Figure 5:
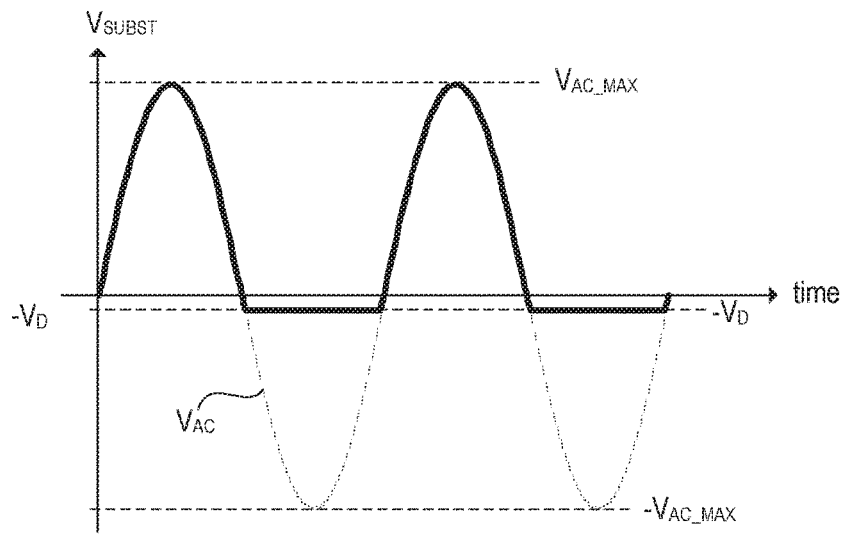
FIG. 5 is a timing diagram illustrating the voltage across the body diode of the MOSFET of FIG. 4, when the MOSFET is connected to a load and not actively switched on while being supplied with an alternating voltage.

FIG. 5 is a timing diagram illustrating the waveform of the substrate voltage $V_{SUBST}$ with respect to the reference potential $V_{REF}$ for the hypothetic case, in which the MOSFET $M_P$ included in the rectifier device 10 is never switched on and, therefore, the load current $i_L$ can only pass the rectifier device 10 via the body diode $D_R$. In this example it is further assumed that an alternating input voltage $V_{AC}$ is applied to a series circuit of the rectifier device 10 and a load (see FIG. 4, resistor $R_V$). Without loss of generality, the reference potential $V_{REF}$ may be defined as 0 V. While the body diode $D_R$ is reverse biased ($V_{SUBST}$>0 V), the substrate voltage $V_{SUBST}$ follows the alternating input voltage $V_{AC}$ and the load current is approximately zero (diode $D_R$ is blocking). While the body diode $D_R$ is reverse biased ($V_{SUBST}$<0V) during normal operation, the substrate voltage $V_{SUBST}$ follows the alternating input voltage $V_{AC}$ as long as the alternating input voltage $V_{AC}$ is higher than the negative forward voltage −$V_D$ of the body diode $D_R$ (e.g. $V_{AC}$>−0.6V). However, when the instantaneous level of the alternating input voltage $V_{AC}$ becomes lower (i.e. more negative) than the negative forward voltage $-V_D$ of the body diode $D_R$ (e.g., $V_{AC}<-0.6V$), the substrate voltage $V_{SUBST}$ will be approximately limited to the negative forward voltage $-V_D$ of the body diode $D_R$ (e.g., $V_{SUBST}-0.6V$). In this situation, the diode $D_R$ is forward biased and thus conductive, and the difference between the (negative) substrate voltage and the alternating input voltage $V_{AC}$ is the voltage drop across the load (e.g., resistor $R_V$ in the example of FIG. 4). The load current $i_L$ actually passing through the rectifier device 10, while ($V_{AC}<-V_D$) depends on the load.

As mentioned above, a voltage drop across the rectifier device 10 of approximately 600 to 700 mV (at room temperature) may cause significant power dissipation. To reduce the substrate voltage $V_{SUBST}$ while the body diode $D_R$ is forward biased, the MOS transistor $M_P$ can be switched on to make the MOS channel of the MOS transistor $M_P$ conductive. In this case, the body diode $D_R$ is bypassed via the low-ohmic current path provided by the MOS channel. However, in the time period in which the body diode $D_R$ is reverse biased (i.e. blocking), the MOS transistor should remain switched off. The logic circuit 14 that controls the switching operation of the MOS transistor $M_P$ is included in the control circuit 11 (see FIG. 4). Accordingly, the rectifier device 10 essentially behaves like a diode with a very low forward voltage of approximately 100-200 millivolts.

As shown in FIG. 4, the control circuit 11 is coupled between the two terminals A and K, at which the alternating input voltage is applied (see FIG. 5). However, some circuit components in the control circuit 11 need a DC supply voltage in order to operate properly. Therefore, the control circuit 11 may include at least one supply circuit, which provides an internal supply voltage $V_S$ for supplying various other circuit components of the control circuit 11. Before explaining exemplary implementations of the control circuit 11 and its function in more detail, an exemplary implementation of the internal supply circuit is explained with reference to FIG. 6.

Figure 6:
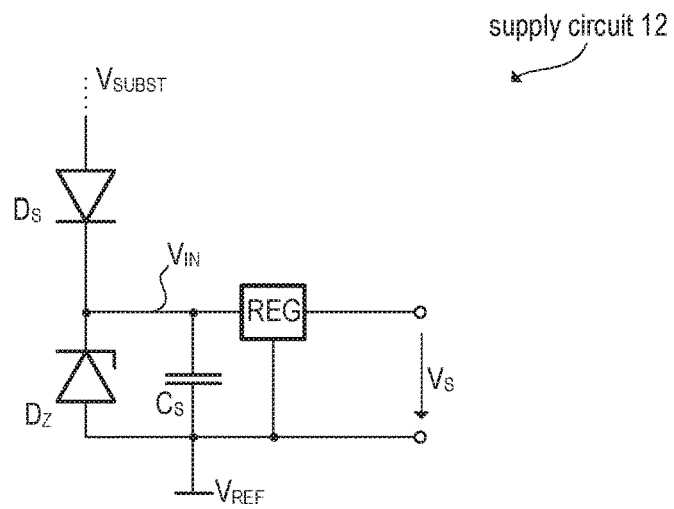
FIG. 6 is a circuit diagram illustrating an exemplary supply circuit which may be included in the control circuit to generate an internal supply voltage.

The exemplary supply circuit 12 illustrated in FIG. 6 is coupled between the first terminal A (reference potential $V_{REF}$) and the second terminal K (substrate voltage $V_{SUBST}$), which are connected to the source and drain of the power MOS transistor $M_P$, respectively. In this example, a series circuit composed of a diode $D_S$ and a Zener diode $D_Z$ is electrically connected between the substrate (being at substrate voltage $V_{SUBST}$) and the source electrode of the MOS transistor $M_P$ (being at reference potential $V_{REF}$). A buffer capacitor $C_S$ is connected parallel to the Zener diode $D_Z$ as shown in FIG. 6. The capacitor $C_S$ is charged via the diode $D_S$ when the level of the substrate voltage $V_{SUBST}$ is higher than the sum of the voltage $V_{IN}$ across the capacitor $C_S$ and the forward voltage of the diode $D_S$. The Zener diode $D_Z$ limits the capacitor voltage $V_{IN}$ across the capacitor $C_S$ to a maximum value, which is determined by the Zener voltage of the Zener diode $D_Z$. Further, the diode $D_S$ prevents the discharging of the capacitor $C_S$ via the substrate when the substrate voltage $V_{SUBST}$ falls to values lower than the capacitor voltage $V_{IN}$. The capacitor voltage $V_{IN}$ may be supplied as input voltage to a voltage regulator device REG, and the input voltage $V_{IN}$ is buffered by the capacitor $C_S$ while the substrate voltage $V_{SUBST}$ is low. The regulated output voltage of the voltage regulator REG is denoted as $V_S$. The regulated output voltage $V_S$ may be regarded as internal supply voltage that is used to supply any circuitry (e.g. logic circuits such as logic circuit 14, see FIG. 4) integrated in the rectifier device 10.

It is noted that the circuit of FIG. 6 should be regarded as an illustrative example and may also be implemented in various alternative ways. For example, the Zener diode $D_Z$ may be replaced by a any voltage limiting circuit configured to limit the capacitor voltage to a desired maximum. Further, diode $D_S$ may be replaced by a transistor that is able to limit the current passing through it. Dependent on the application, the Zener diode $D_Z$ may be omitted. The capacitor $C_S$ may be replaced by any circuit (e.g. series or parallel circuit of several capacitors) that provides a sufficient capacitance to be able to buffer the input voltage $V_{IN}$ while the substrate voltage $V_{SUBST}$ is too low to charge the capacitor $C_S$. In some implementations, the voltage regulator REG may be substituted by other circuitry that provides a similar function. If the capacitance of the capacitor $C_S$ is high enough to ensure an acceptably low ripple, the regulator REG may be also omitted.

Figure 7A:
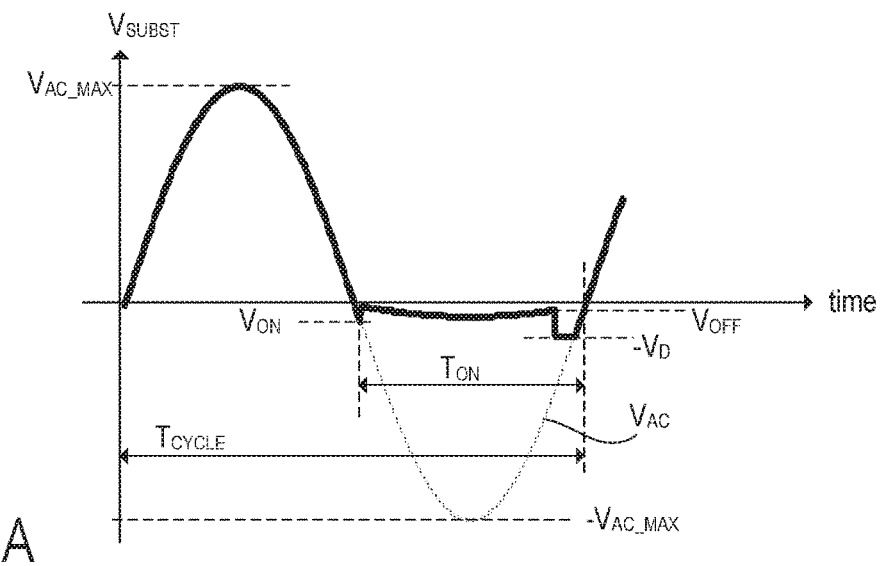
FIGS. 7A and 7B are timing diagrams illustrating one example of how the MOSFET of FIG. 4 may be switched on and off when supplied with an alternating voltage.
Figure 7B:
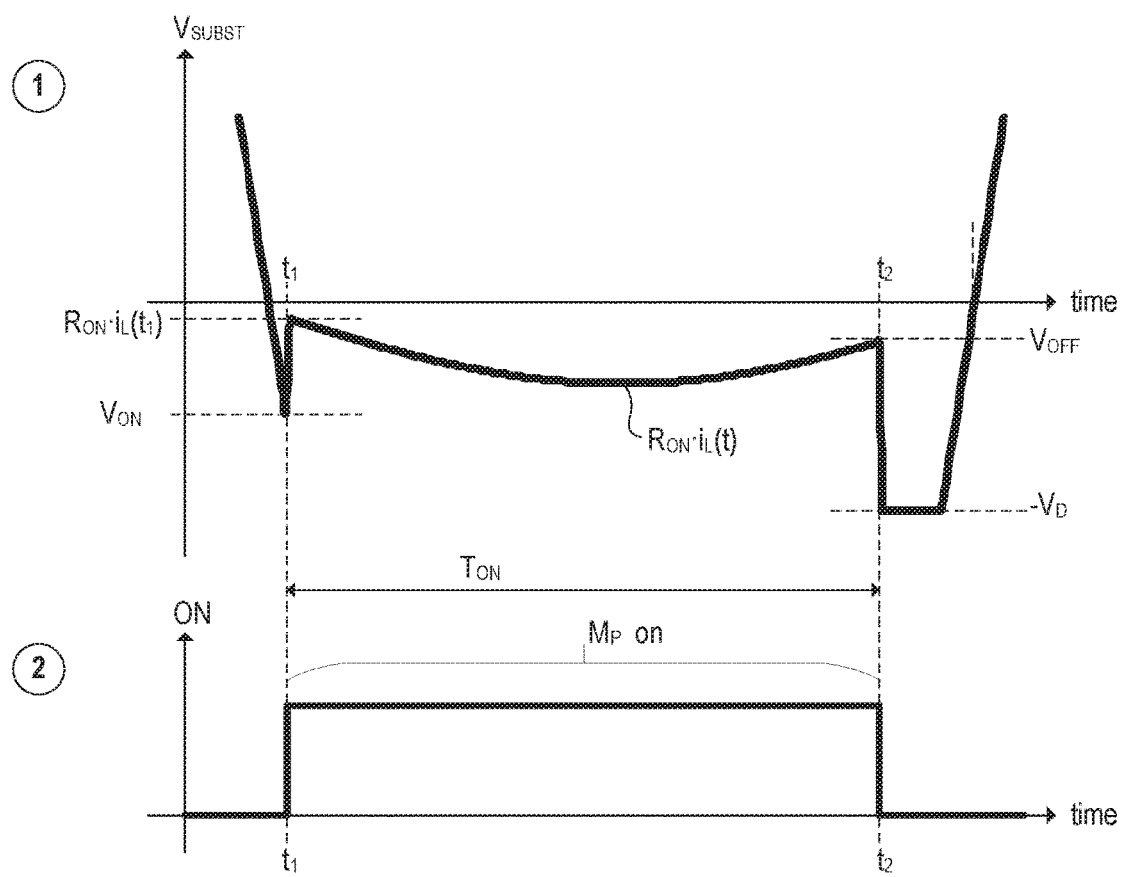

FIGS. 7A and 7B include timing diagrams illustrating the function of one exemplary embodiment of the rectifier device 10 implemented according to the basic example of FIG. 4. In particular, the function of the control logic used to switch on and switch off of the MOS transistor $M_P$ is illustrated by the timing diagrams of FIGS. 7A and 7B. The diagram of FIG. 7A is essentially the same as the diagram of FIG. 5 except that, in the current example, power MOS transistor $M_P$ is switched on when the intrinsic body diode $D_R$ is forward biased in order to bypass the body diode $D_R$ via the activated MOS channel. The bypassing of the body diode $D_R$ results in a voltage drop across the rectifier device 10 which is significantly lower than the forward voltage of a normal diode.

The first diagram of FIG. 7B shows a magnified segment of the waveform shown in FIG. 7A. FIG. 7A shows a full cycle of the substrate voltage $V_{SUBST}$, whereas the first diagram of FIG. 7B only shows approximately the second half of the cycle, during which the substrate voltage $V_{SUBST}$ is negative. The second diagram of FIG. 7B illustrates a simplified waveform of the logic signal ON (see FIG. 4) which triggers the activation/deactivation of the MOS transistor $M_P$ to switch it on and off. As can be seen in FIGS. 7A and 7B, the MOS transistor $M_P$ is switched on when the control circuit 11 detects (by means of logic circuit 14, see FIG. 4) that the substrate voltage $V_{SUBST}$ is negative (i.e. the diode $D_R$ is forward biased). This detection can be made based on various criteria. In the present example, negative threshold voltages $V_{ON}$ and $V_{OFF}$ are used to determine the time instants for switching the MOS transistor $M_P$ on and off (i.e. begin and end of the on-time period $T_{ON}$ of MOS transistor $M_P$). Accordingly, the MOS transistor $M_P$ is switched on when the substrates voltage $V_{SUBST}$ reaches or falls below the first threshold $V_{ON}$, and the MOS transistor $M_P$ is switched off when the substrates voltage $V_{SUBST}$ again reaches or exceeds the second threshold $V_{OFF}$.

In the present example, the condition $V_{SUBST}=V_{ON}$ is fulfilled at time $t_1$ and the control signal ON (see second diagram of FIG. 7B), as well as the corresponding gate voltage $V_G$, are set to a high level to switch the MOS transistor $M_P$ on. When the substrate voltage $V_{SUBST}$ reaches or exceeds the second threshold $V_{OFF}$ at the end of a cycle, the MOS transistor $M_P$ is switched off again. In the present example, the condition $V_{SUBST}=V_{OFF}$ is fulfilled at time $t_2$ and the control signal ON (see bottom diagram of FIG. 7B), as well as the corresponding gate voltage $V_G$, are set to a low level to switch the MOS transistor $M_P$ off. When the MOS transistor $M_P$ is switched off at time $t_2$, the substrate voltage $V_{SUBST}$ may abruptly fall to $-V_D$ before it again rises to positive values at the beginning of the next cycle. It is understood that the waveforms shown in FIGS. 7A and 7B are merely an illustrative example and are not to scale.

While the MOS transistor $M_P$ is switched on (i.e. during the on-time period $T_{ON}$), the substrate voltage $V_{SUBST}$ equals $R_{ON} \cdot i_L$, wherein $R_{ON}$ is the on-resistance of the activated MOS channel. In the present example, only two threshold values are used to switch the MOS transistor $M_P$ on and off. However, two or more threshold values may be used to switchon and/or switchoff. In this case the power MOSFET may be switched on or off (or both) gradually (stepwise) by subsequently switching on/off two or more groups of transistor cells of the power MOSFET.

Referring back to FIG. 7A, both the first threshold $V_{ON}$ and the second threshold $V_{OFF}$ are negative (note that the reference voltage $V_{REF}$ is defined as zero), but higher than the negative forward voltage $-V_D$ of the body diode $D_R$ of the MOS transistor $M_P$. Further, the second threshold $V_{OFF}$ may be higher (less negative) than the first threshold $V_{ON}$. That is, the condition $-V_D<V_{ON}<V_{OFF}<0$ V is fulfilled in the present example, e.g. $V_{ON}=-250$ mV and $V_{OFF}=-50$ mV, while $-V_D=-700$ mV. At this point it should be noted that the cycle time $T_{CYCLE}$ is given by the frequency of the AC input voltage $V_{AC}$.

As can be seen in FIG. 7B, the MOS transistor $M_P$ should only switch on once in each cycle (see FIG. 7A, period $T_{CYCLE}$) of the substrate voltage $V_{SUBST}$, specifically, when the condition $V_{SUBST}=V_{ON}$ is met for the first time. When the condition is met again in the same cycle, a second switch-on of the MOS transistor $M_P$ should be prevented (e.g. at time instant $t_2$, see first diagram of FIG. 7A). Similarly, the MOS transistor $M_P$ should be switched off when the condition $V_{SUBST}=V_{OFF}$ is met at the end of a cycle. If this condition is met earlier during a cycle (e.g. shortly after time $t_1$, if $R_{ON} \cdot i_L(t_1)>V_{OFF}$), an early switch-off of the MOS transistor should be prevented. In order to avoid an undesired early switch-off of the MOS transistor, the control circuit may include a timer that prevents a switch-off for a specific time span (e.g. during the first half of the on-time $T_{ON}$). It is noted that the control logic (e.g. control logic 14, see FIG. 4) that exhibits the behaviors illustrated in FIGS. 7A and 7B may be implemented in numerous different ways. The actual implementation may depend on the application as well as on the semiconductor technology used to manufacture the rectifier device 10. It is understood that a skilled person is able to implement the functionality discussed above with reference to FIGS. 7A and 7B.

Figure 8:
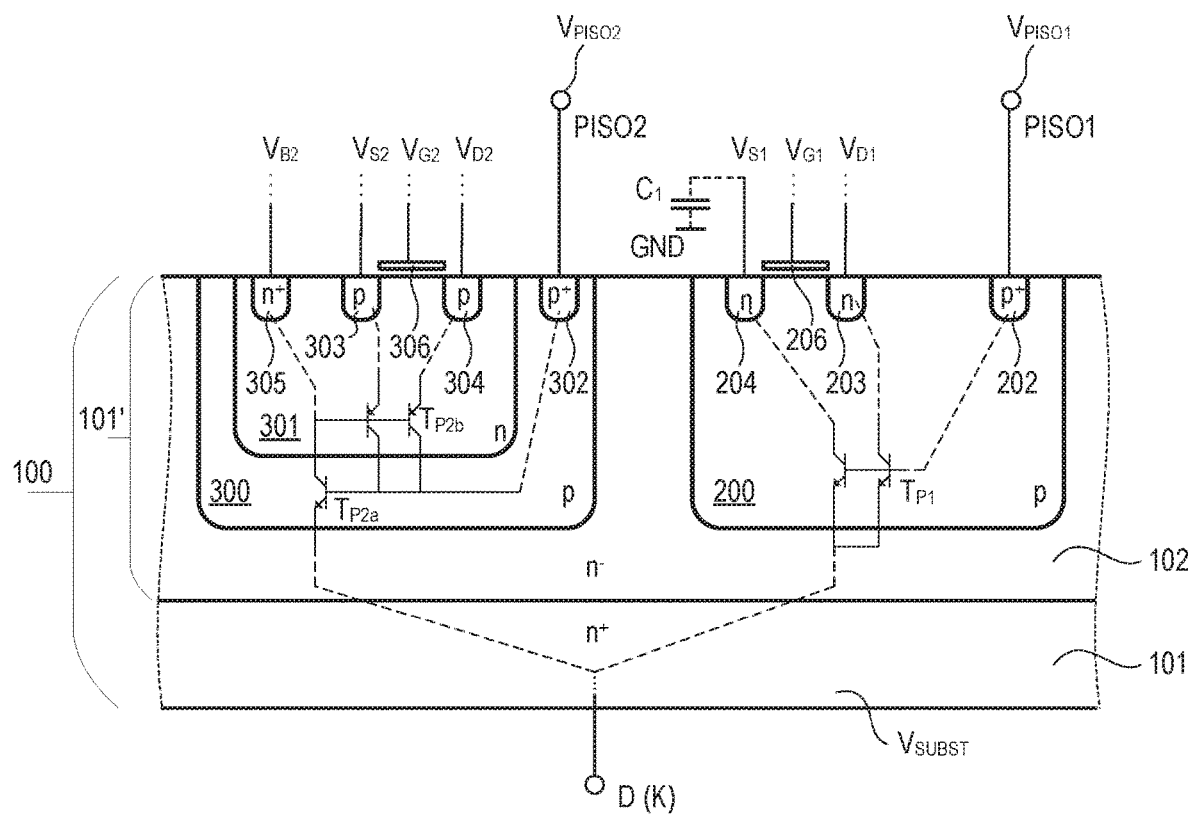
FIG. 8 is a cross-sectional view of a semiconductor body similar to FIG. 3; parasitic components which may give rise to latch-up effects are illustrated in this Figure.

FIG. 8 is a simplified cross-sectional view of a rectifier device as described herein with reference to FIGS. 1 to 7. An example of the portion of the rectifier device, which includes the power MOS transistor $M_P$, has been described with reference to in FIG. 3. As mentioned, other circuitry is integrated in the same semiconductor substrate such as the control circuit 11 (see FIG. 4) which may include the logic circuit 14 and the supply circuit 12. When—as in the example of FIG. 3—the power MOS transistor is an n-channel transistor, the semiconductor substrate 101 will be doped with dopants of the first type (n-type). Therefore, analogously to the example of FIG. 3, the semiconductor body 100 shown in FIG. 8 is essentially formed by the semiconductor substrate 101 (wafer), on which the (e.g. monocrystalline) semiconductor layer 101' is deposited using epitaxial growth. The semiconductor layer 101' is doped with dopants of the same type as the type of the dopants used for doping the substrate 101, wherein the concentration of dopants may be much lower in the semiconductor layer 101' (therefore labelled n) as compared to the highly doped substrate 101 (labelled n+).

Well regions 200 and 300 may be formed in the semiconductor layer 101', e.g., using ion implantation, diffusion of dopants or other known doping processes. During fabrication, the well regions 200 and 300 may be formed in the same or in a different step as the body regions 103 shown in FIG. 3, and the type of dopants used to dope the well regions 200 and 300 is complementary to the type of dopants used to dope the semiconductor layer 101'. That is, well regions 200 and 300 are p-doped (thus referred to as p-wells) in case the substrate 101 and the semiconductor layer 101' are n-doped (thus referred to as n-substrate). Similar to the body regions 103, the p-wells 200 and 300 extend, from the top surface of the semiconductor body 100, vertically into the semiconductor layer 101' and are laterally confined by the material of the surrounding semiconductor layer 101'. Various circuit components may be integrated in the p-wells 200 and 300 and further p-wells. In the present example of FIG. 8, well region 200 includes an n-channel MOSFET and well region 300 includes a p-channel MOSFET. These two MOSFETs may be combined to form, e.g., a CMOS inverter or other circuitry. It is, however, emphasized that these two MOSFETs have to be merely regarded as representatives for arbitrary circuits and circuit elements (e.g. control circuit 11, see FIG. 4) integrated in the well regions 200 and 300 and other well regions in the semiconductor body 100. The individual integrated circuit components may be connected to form a specific circuit by conductive lines formed in one or more wiring layers on top of the semiconductor body 100. The wiring of integrated circuit components is as such known and thus not further explained herein.

To from an n-channel MOSFET in p-well 200, a drain region 203 and a source region 204 are formed within the p-well 200 and embedded therein. Drain region 203 and source region 204 are both doped with n-type dopants. A gate electrode 206 is arranged on the top surface of the semiconductor body 100, but electrically isolated therefrom. The gate electrode 206 extends between the drain region 203 and the source region 304. The p-well 200 can be regarded as the transistor body region and—when the gate electrode 206 is sufficiently charged during operation—an (n-type) MOS channel is generated in that portion of the p-well 200, which separates drain region 203 and source region 204 from each other. A well contact region 202 may also be formed within the p-well 200 and allows to contact the p-well 200. Usually, the well contact region 202 is p-doped but with a higher concentration of dopants than the p-well 200.

To from a p-channel MOSFET in p-well 300 an additional n-doped well 301 (n-well) is embedded in p-well 300. The n-well 301 may also be formed using ion implantation, diffusion of dopants or other known doping processes. It extends from the top surface of the semiconductor body vertically into the p-well 300 and thus is embedded within the p-doped semiconductor material of the p-well 300. Analogously to the n-channel MOSFET in p-well 200, a drain region 303 and a source region 304 are formed within the n-well 301. A gate electrode 306 is arranged on the top surface of the semiconductor body 100, but electrically isolated therefrom. The gate electrode 306 extends between the drain region 303 and the source region 304. The n-well 301 can be regarded as transistor body region, and—when the gate electrode 306 is sufficiently charged during operation—an (p-type) MOS channel is generated in that portion of the n-well 301, which separates drain region 303 and source region 304 from each other. A body contact region 305 is formed in the n-well 301 to allow to electrically contact the n-well 301. The body contact region is usually n-doped like the n-well but with a higher concentration of dopants that the n-well 301. Further, a well contact region 302 may also be formed within the p-well 300 and allows to contact the p-well 300. Usually, the well contact region 302 is p-doped but with a higher concentration of dopants than the p-well 300 (like well contact region 202).

As shown in FIG. 8, the voltage (potential) of the p-well 200 is denoted as $V_{PISO1}$ and the voltage (potential) of the p-well 300 is denoted as $V_{PISO2}$. Drain, source, and gate voltage of the n-channel MOSFET in p-well 200 are denoted as $V_{D1}$, $V_{S1}$, and $V_{G1}$, respectively. The body voltage $V_{B1}$ of the n-channel MOSFET equals $V_{PISO1}$, whereas the body voltage $V_{B2}$ of the p-channel MOSFET is different from $V_{PISO2}$. Drain, source, gate, and body voltage of the p-channel MOSFET in n-well 301 are denoted as $V_{D2}$, $V_{S2}$, $V_{G2}$, and $V_{B2}$, respectively. One can see from FIG. 8, that a pn-junction is formed at the interface between the n-doped semiconductor layer 101' and the p-wells 200, 300. It is desired that—during normal operation—this pn-junction is reversed biased and thus forms a so-called pn-junction isolation. In applications with DC supply, the n-substrate 101 is usually electrically connected with the highest available DC supply voltage (i.e. substrate voltage $V_{SUBST}$ corresponds to the highest available supply voltage) and, as a result, the mentioned pn-junction isolation is always reverse biased and thus in a blocking state. However, the examples described herein relate to rectifier devices, which are operated with an alternating supply (input) voltage that is applied between drain and source of the power MOS transistor $M_P$ integrated in the rectifier device (see, e.g., FIGS. 3 and 4). As the drain of the power MOS transistor $M_P$ is electrically connected to the n-substrate (see FIG. 3, drain electrode 116, substrate 101), the substrate voltage $V_{SUBST}$ is not a DC voltage but an alternating voltage as shown, for example, in FIG. 7A.

As can be seen in FIG. 7A, the substrate voltage $V_{SUBST}$ cyclically assumes negative values (if the reference potential $V_{REF}$ is defined as 0V), and thus the above-mentioned pn-junction isolation may be come forward biased which may cause a latch-up of the rectifier device. A latch-up may be caused by an undesired activation of parasitic transistors shown in FIG. 8 and explained in the following. The pn-junction between p-well 200 and the subjacent n-doped semiconductor layer 101' may form the base-emitter diode of a parasitic npn-type bipolar junction transistor $T_{P1}$. The pn-junctions between the p-well 200 and the n-doped drain and source regions 203, 204 form multiple collector-base diodes of the parasitic transistor $T_{P1}$. One can see from FIG. 8 that parasitic transistor $T_{P1}$ may be switched on, when the substrate voltage $V_{SUBST}$ becomes negative and thus the base-emitter diode of transistor $T_{P1}$ becomes forward biased. An activated (switched on) parasitic transistor $T_{P1}$ may de-facto short-circuit the substrate 101 with drain and source regions 203, 204, which may irreversibly damage the rectifier device.

Similar to parasitic transistor $T_{P1}$, the pn-junction between p-well 300 and the subjacent n-doped semiconductor layer 101' may form the base-emitter diode of a further parasitic npn-type bipolar junction transistor $T_{P2a}$. The pn-junction between the p-well 300 and the n-well 301 form the collector-base diode of the parasitic transistor $T_{P2a}$. Simultaneously, the pn-junction between the p-well 300 and the n-well 301 form the collector-base diode of a parasitic pnp-type bipolar junction transistor $T_{P2b}$, whose multiple emitters are formed by the drain and source regions 303 and 304 embedded in n-well 301. The two parasitic transistors $T_{P2a}$ and $T_{P2b}$ are connected in a way that they form a thyristor (pnpn-structure) with the p-well 300 forming the thyristor's gate. This thyristor may be switched on, when the substrate voltage $V_{SUBST}$ becomes negative and thus the base-emitter diode of transistor $T_{P2a}$ becomes forward biased (which in turn leads to an activation of transistor $T_{P2b}$). The activated (switched on) thyristor may de-facto short-circuit the substrate 101 with drain and source regions 303, 204, which also may irreversibly damage the rectifier device.

To prevent short circuits, latch-up and similar effects in the rectifier device due to the activation of parasitic bipolar junction transistors or thyristors the pn-junction isolations between the substrate 101 and the p-wells 200 and 300 (and further p-wells) have to be maintained in an isolating state during any operation state of the rectifier device, even during operation states, in which the substrate voltage $V_{SUBST}$ is negative. In other words, the pn-junctions between the n-doped semiconductor layer 101' and the p-wells 200 and 300 have to be (and maintained) reverse biased irrespective of the polarity of the substrate voltage $V_{SUBST}$.

One solution of the above-described problem with regard to latch-up and similar effects is to employ a circuit including one or more switches configured to electrically connect the p-wells (e.g. p-wells 200 and 300) to the substrate 101 during operating states, in which the substrate voltage is negative with respect to ground potential, which is the potential of the anode terminal of the rectifier device 10 (i.e. the source electrode of the MOS transistor $M_P$, see FIG. 4). In this regard "to electrically connect" means to connect by a comparably low-resistance current path, which may be provided, e.g. by an active MOS channel of a MOS transistor.

Figure 9:
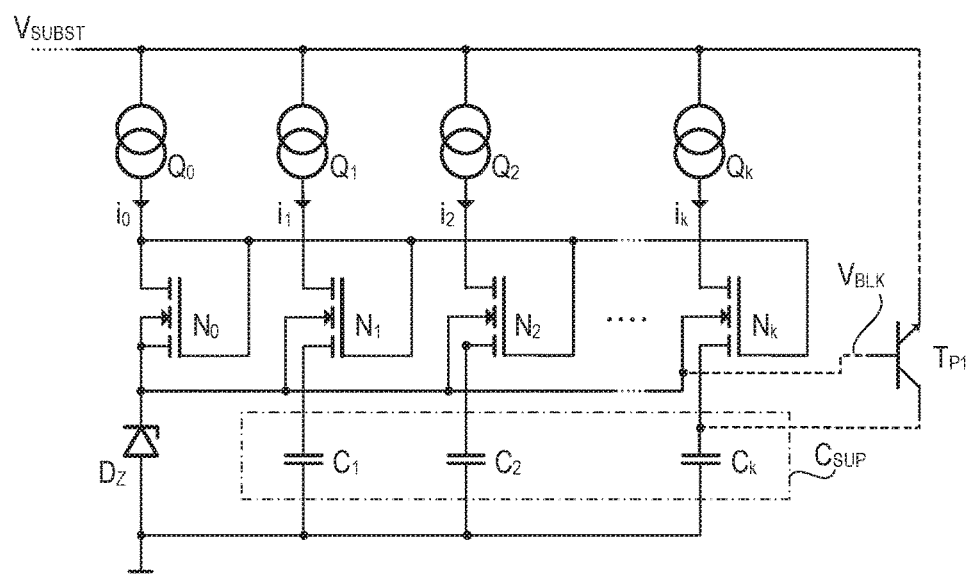
FIG. 9 is a circuit diagram illustrating an further example of a supply circuit which may be included in the control circuit to generate an internal supply voltage.

As mentioned above, the rectifier device 10 can be designed as a two-terminal device (anode and cathode terminal A, K) and thus need to generate an internal supply voltage $V_S$ from the alternating substrate voltage $V_{SUBST}$. One simple example of a supply circuit 12 has been discussed with reference to FIG. 6. FIG. 9 illustrates a more complex implementation of the supply circuit 12, which includes a plurality of capacitors $C_1$, $C_2$, . . . , $C_k$ to store charge and to provide the internal supply voltage $V_S$. As in the example of FIG. 6, the voltage across the capacitors $C_1$, $C_2$, . . . , $C_k$ is determined by the Zener voltage of a Zener diode $D_Z$. Different from the example of FIG. 6, the diode $D_S$ (see FIG. 6) is replaced by a plurality of coupled MOS transistors $N_0$, $N_1$, $N_2$, . . . , $N_k$, which are connected to the capacitors $C_1$, $C_2$, . . . , $C_k$ as shown in FIG. 9.

In accordance with FIG. 9, the MOS transistor $N_0$ is an n-channel MOSFET which is connected as a diode, i.e. its gate electrode is connected to its drain, wherein body (bulk) and source of the MOS transistor $N_0$ are electrically connected. The Zener diode $D_Z$ is connected between the source of MOS transistor $N_0$ and ground GND. Consequently, the source voltage and the bulk voltage of the MOS transistor $N_0$ are determined by the Zener voltage $V_Z$ of the Zener diode $D_Z$ if the substrate voltage is high enough so that the MOS transistor $N_0$ (behaving like a diode) is conductive and a drain current $i_0$ passes through the MOS transistor $N_0$. The current source $Q_0$ electrically connected between substrate (cathode terminal) and the drain of MOS transistor $N_0$ is merely for current limitation and may be replaced by a resistor or even omitted, dependent on the actual application. If the substrate voltage $V_{SUBST}$ falls below a specific threshold value, which depends on the Zener voltage $V_Z$, the threshold voltage of the MOS transistor $N_0$ and the minimum voltage drop across the current source $Q_0$, the MOS transistor $N_0$ will switch off.

The MOS transistors $N_1, N_2, \ldots, N_k$ are coupled with MOS transistor $N_0$ so that the gate electrodes of the transistors $N_0, N_1, \ldots, N_k$ are electrically interconnected. Similarly, the body (bulk) terminals of the transistors $N_0, N_1, \ldots, N_k$ are electrically interconnected. Consequently, the transistors $N_1, N_2, \ldots, N_k$ "see" the same gate-bulk voltage $V_{GB}$ as transistor $N_0$. The drain terminals of the transistors $N_1, N_2, \ldots, N_k$ may be connected to substrate (cathode terminal) via current sources $Q_1, \ldots, Q_k$ in the same way as the drain terminal of transistor $N_0$. The current sources $Q_1, \ldots, Q_k$ limit the drain currents $i_1, i_2, \ldots, i_k$ of the transistors $N_1, N_2, \ldots, N_k$ when the substrate voltage $V_{SUBST}$ is at a high level and greater than the above-mentioned specific threshold. It is understood that the current sources $Q_0, Q_1, \ldots, Q_k$ may be replaced by resistors or even omitted dependent on the actual implementation. The drain currents $i_1, i_2, \ldots, i_k$ of the transistors $N_1, N_2, \ldots, N_k$ charge the capacitors $C_1, C_2, \ldots, C_k$ as long as the substrate voltage $V_{SUBST}$ is high enough to activate the transistors $N_0, N_1, \ldots, N_k$.

The transistors $N_1, N_2, \ldots, N_k$ may be n-channel MOS transistors and implemented one or more p-well regions such as the p-well region 200 as shown in FIG. 8. As an illustrative example capacitor C1 is also shown in FIG. 8, in which the n-channel MOS transistor in p-well 200 can be regarded as example for the transistor $N_1$ in FIG. 9. Accordingly, each one of the transistors $N_0, N_1, \ldots, N_k$ entails a parasitic bipolar junction transistors (BJT) that—when activated while the substrate voltage $V_{SUBST}$ is negative—will cause discharging the capacitors $C_1, C_2, \ldots, C_k$ and, as a consequence, the internal voltage supply will fail. It is thus important to avoid activation of the parasitic BJTs. In FIG. 9, the parasitic BJT coupled to MOS transistor $N_k$ is labelled $T_{P1}$ (cf. FIG. 8).

Figure 10:
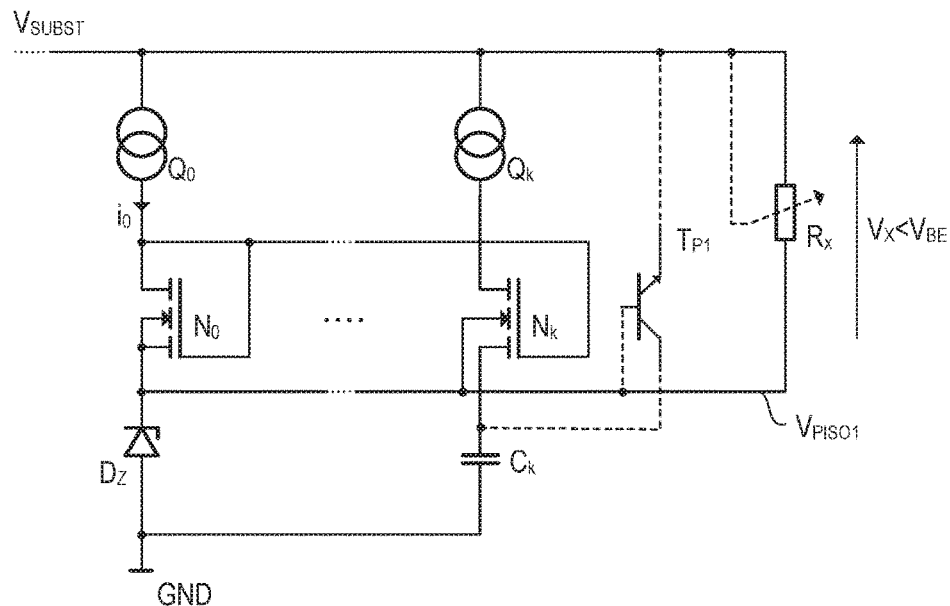
FIG. 10 illustrates the supply circuit of FIG. 9 including a variable resistance configured to prevent activation of parasitic components.

The example of FIG. 10 is basically the same circuit as shown in FIG. 9 with additional circuitry that helps to avoid activation of the mentioned parasitic BJTs. In a simple example as shown in FIG. 10, this circuitry is a single resistor $R_x$ connected between the p-well (see, e.g., FIG. 8, well-region 200) that forms the body of the $N_0, N_1, \ldots, N_k$ and substrate (cathode terminal, cf. FIG. 8, regions 101 and 102). The resistance of the resistor $R_x$ needs to be so low that the electric potential $V_{PISO1}$ is pulled to values low enough to avoid activation of BJT $T_{P1}$. Accordingly, the voltage $V_x = V_{PISO1} - V_{SUBST}$ (for negative substrate voltages $V_{SUBST}$) across the resistor $R_x$ should remain below the forward voltage $V_{BE}$ (approximately 0.6 volts) of the base-emitter diode of BJT Tri. However, the resistor $R_x$ having such as small resistance may cause a significant bias current, when the substrate voltages $V_{SUBST}$ is high, and such a bias current may be undesired at least in some applications. At this point, a conflict of objectives occurs, a low resistance is needed to void activation of parasitic BJTs when the substrate voltage $V_{SUBST}$ is negative and a high resistance is desired to keep the bias currents low when the substrate voltage reaches higher positive levels.

Figure 11:
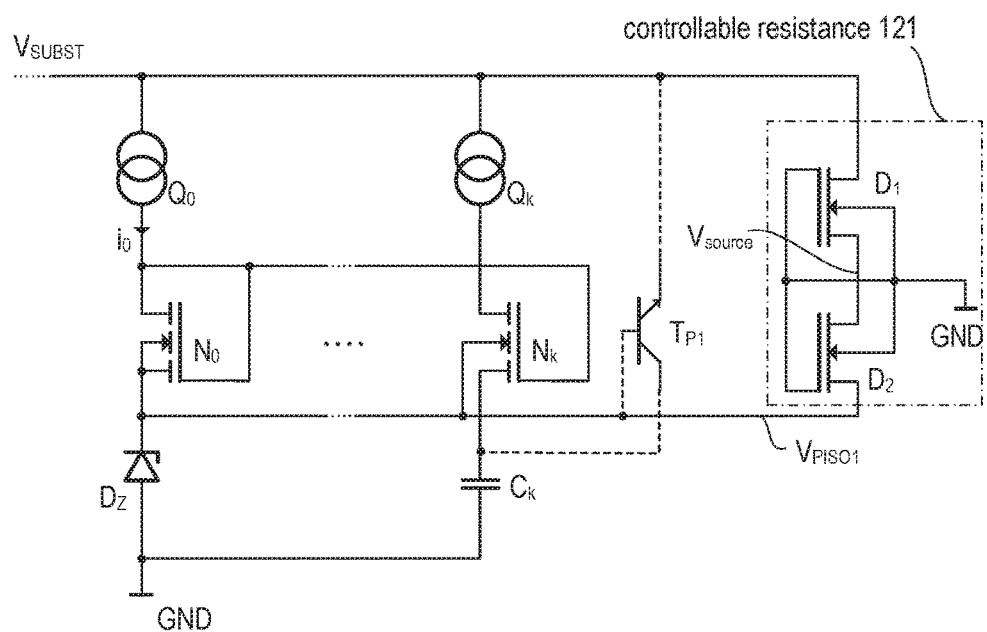
FIG. 11 illustrates one exemplary implementation of the supply circuit of FIG. 9 including a variable resistance circuit with two transistors.

In order to improve the situation, resistor $R_x$ may be replaced by a circuit that behaves like a resistor with a controllable resistance. In this case, the resistance is variable and dependent on the substrate voltage $V_{SUBST}$ such that the resistance is high for positive substrate voltages $V_{SUBST}$ and low for negative substrate voltages $V_{SUBST}$. One example of how controllable resistance circuit may be implemented is shown in FIG. 11, which is identical to the previous example of FIG. 10 except that resistor $R_x$ has been replaced by the controllable resistance circuit 121. In accordance with the example of FIG. 11, the circuit 121 includes two transistors, $D_1$ and $D_2$, which may be implemented as depletion MOS transistors. The gate electrodes and the body (bulk) terminals of the transistors $D_1$ and $D_2$ are electrically interconnected and connected to ground (GND). In another embodiment, the gate electrodes and the body (bulk) terminals of the transistors $D_1$ and $D_2$ may be biased with a predefined potential different from ground potential GND. The source terminal of transistor $D_1$ is connected to the source terminal of transistor $D_2$; the drain terminals of the transistors $D_1$ and $D_2$ are connected to substrate (see, e.g., FIG. 8, regions 101 and 102) and the p-well-region (see, e.g., FIG. 8, regions 101 and 102) that forms the body regions of the MOS transistors $N_0, N_1, \ldots, N_k$. Accordingly, the MOS channels of the two transistors $D_1$ and $D_2$ are connected in series and the transistors are operated in the linear region (also triode mode or ohmic mode) when the substrate voltage $V_{SUBST}$ is negative or at low positive levels. In such a situation, the transistors $D_1$ and $D_2$ behave similar to a resistive voltage divider, and the source voltage $V_{Source}$ of the transistors is between the p-well voltage $V_{PISO1}$ and the substrate voltage $V_{SUBST}$.

When, however, the substrate voltage $V_{SUBST}$ rises to higher positive levels, the so-called body effect (also bulk effect) causes a significant increase of the on-resistance of the transistors $D_1$ and $D_2$, while the gate-body voltage remains constant (at zero volts in the present example). The body effect causes the threshold voltage $V_{TH}$ of transistors $D_1$ and $D_2$ to increase by $\Delta V_{TH}$, which depends on the source-body voltage $V_{SB}$. As compared with the threshold voltage for $V_{SB}=0$ the threshold voltage $V_{TH}$ increases by $$\Delta V_{TH} = \gamma(\sqrt{V_{SB}+2\phi_B} - \sqrt{2\phi_B})$$

when $V_{SB} > 0$, wherein $\gamma$ is a material parameter (body effect parameter) and $2\phi_B$ is the potential drop between the surface and body across the depletion layer of the MOS transistor. As the substrate voltage $V_{SUBST}$ rises (in every period, see FIG. 7A), the source voltage $V_{source}$ rises accordingly and, due to the body effect, the threshold voltage $V_{TH}$ of the transistors $D_1$ and $D_2$ also rises. The threshold voltage $V_{TH}$ will rise to such high values (while the gate-body voltage remains constant at zero volts) that the on-resistance of the transistors $D_1$ and $D_2$ significantly increases. Accordingly, the bias current passing through the transistors is significantly reduces as compared with the previous circuit of FIG. 10. When the substrate voltage $V_{SUBST}$ decreases again, the source voltage $V_{source}$ and thus the threshold voltage $V_{TH}$ will also decrease (while the gate-body voltage remains constant at zero volts) until the threshold voltage $V_{TH}$ becomes negative and the transistors $D_1$ and $D_2$ are switched on again (low ohmic state).

It is understood that the transistors $D_1$ and $D_2$ are not necessarily depletion-type MOS transistors but can also be realized as enhancement-type MOS transistor. In this case, the gate-body voltage has to be greater than zero instead of zero volts as in the example of FIG. 11.

Figure 12A:
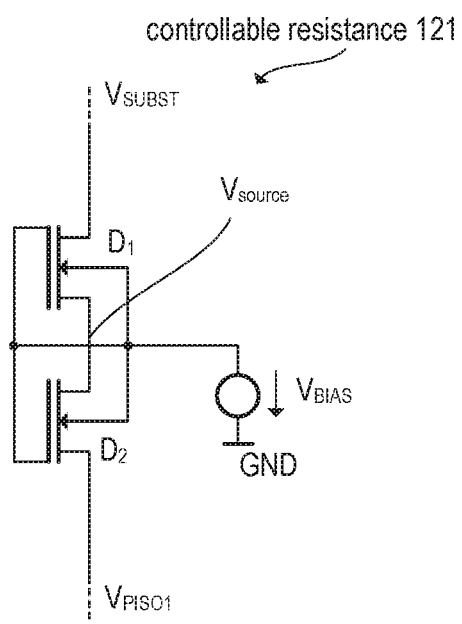
FIGS. 12A and 12B illustrate two exemplary modifications of the circuit of variable resistance circuit of FIG. 11.
Figure 12B:
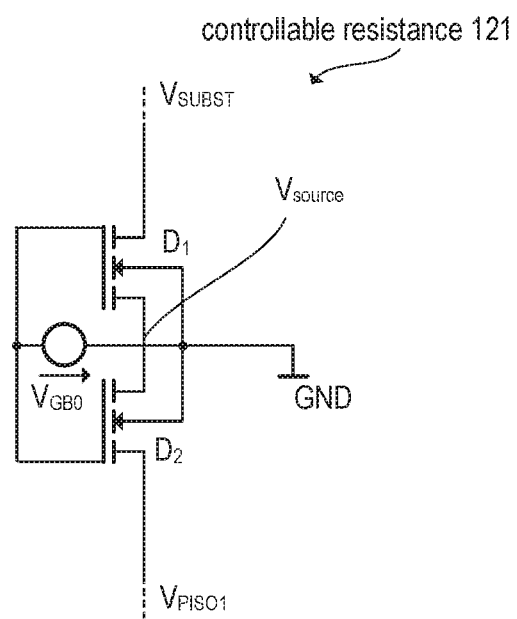

FIGS. 12A and 12B illustrate two exemplary modifications of the circuit of variable resistance circuit of FIG. 11. The example of FIG. 12A is basically the same as the variable resistance circuit 121 shown in FIG. 11 except that the gates and the bulk terminals of the transistors $D_1$ and $D_2$ are connected to a circuit node at which a (e.g. constant) bias voltage $V_{BIAS}$ is provided (instead of being connected to ground as in FIG. 11). If the bias voltage $V_{BIAS}$ is (slightly) negative, the mentioned body effect may be greater as compared to the example of FIG. 11. The example of FIG. 12B is basically the same as the variable resistance circuit 121 shown in FIG. 11 except that an (e.g. constant) offset voltage $V_{GB0}$ is provided between the gates and the bulk terminals of the transistors $D_1$ and $D_2$. This modification may be useful if the transistors $D_1$ and $D_2$ are enhancement-type transistors, whereas depletion-type transistors are used in the previous examples. It is noted, that the modifications of FIGS. 12A and 12B may be combined and that, in other embodiments, different (e.g. constant) gate and bulk voltages may be applied to the two transistors $D_1$ and $D_2$. Replacing one of the transistors $D_1$ or $D_2$ by a "normal" resistor (e.g. made of polycrystalline silicon) may also be an option.

Although various embodiments have been illustrated and described with respect to one or more specific implementations, alterations and/or modifications may be made to the illustrated examples without departing from the spirit and scope of the features and structures recited herein. With particular regard to the various functions performed by the above described components or structures (units, assemblies, devices, circuits, systems, etc.), the terms (including a reference to a "means") used to describe such components are intended to correspond—unless otherwise indicated—to any component or structure that performs the specified function of the described component (e.g., that is functionally equivalent), even if it is not structurally equivalent to the disclosed structure that performs the function in the herein illustrated exemplary implementations of the present disclosure.

The invention claimed is:

1. A rectifier device comprising:
   a semiconductor body doped with dopants of a first doping type;
   one or more well regions arranged in the semiconductor body and doped with dopants of a second doping type, the one or more well regions and the semiconductor body forming a pn-junction;
   an anode terminal and a cathode terminal connected by a load current path of a first MOS transistor and a diode connected parallel to the load current path, wherein an alternating input voltage is operably applied between the anode terminal and the cathode terminal;
   a control circuit that is configured to switch on the first MOS transistor for an on-time period, during which the diode is forward biased, the first MOS transistor and the diode being integrated in the semiconductor body and the control circuit being at least partly arranged in the one or more well regions; and
   a controllable resistance circuit that is electrically connected between the semiconductor body and a first well region of the one or more well regions and configured to provide a resistive current path between the semiconductor body and the first well region, a resistance of the resistive current path being dependent on an instantaneous level of the alternating input voltage.

2. The rectifier device of claim 1, wherein the controllable resistance circuit comprises:
   a second MOS transistor and a third MOS transistor connected in series, wherein a drain-source current path of the second MOS transistor is connected in series with a drain-source current path of the third MOS transistor,
   wherein the semiconductor body and the first well region are connected via the series connection of the second MOS transistor and the third MOS transistor.

3. The rectifier device of claim 2,
   wherein the second MOS transistor is configured to receive a constant first gate-body voltage, and/or
   wherein the third MOS transistor is configured to receive a constant second gate-body voltage.

4. The rectifier device of claim 3,
   wherein the constant first gate-body voltage and the second constant gate-body voltage are zero.

5. The rectifier device of claim 1,
   wherein gate and bulk terminals of both, the second MOS transistor and the third MOS transistor, are connected to a circuit node that is at ground potential.

6. The rectifier device of claim 1, further comprising:
   a supply circuit configured to provide an internal supply voltage based on the alternating input voltage, the supply circuit including at least one further transistor formed in the first well region.

7. The rectifier device of claim 6,
   wherein the supply circuit includes at least one capacitor connected to a source terminal of the at least one further transistor.

8. A semiconductor device comprising:
   a semiconductor body doped with dopants of a first doping type;
   one or more well regions arranged in the semiconductor body and doped with dopants of a second doping type, an alternating substrate voltage being operably applied to the semiconductor body;
   a supply circuit configured to provide an internal supply voltage based on the alternating substrate voltage for supplying further circuitry included in the semiconductor body, the supply circuit including at least one capacitor and at least one transistor formed in a first well region of the one or more well regions,
   wherein the at least one transistor is coupled between the semiconductor body and the at least one capacitor and configured to charge the at least one capacitor when the alternating substrate voltage is higher than a threshold voltage; and
   a controllable resistance circuit that is electrically connected between the semiconductor body and the first well region and configured to provide a resistive current path between the semiconductor body and the first well region, a resistance of the resistive current path being dependent on an instantaneous level of the alternating substrate voltage.

9. The semiconductor device of claim 8, wherein the controllable resistance circuit comprises:
   a first MOS transistor and a second MOS transistor connected in series, wherein source electrodes of the first MOS transistor and the second MOS transistor are electrically connected,
   wherein the semiconductor body and a first well region are connected via the series connection of the first MOS transistor and the second MOS transistor.

10. The semiconductor device of claim 9,
    wherein first gate and bulk terminals of the first MOS transistor and second gate and bulk terminals of the second MOS transistor are connected to circuit node that is at a constant voltage.

* * * * *